United States Patent [19]

Diepeveen

[11] 3,949,926

[45] Apr. 13, 1976

[54] APPARATUS FOR INCREMENTAL MOVEMENT OF DIE FRAME

[76] Inventor: John C. Diepeveen, 1737 Kimberly Drive, Sunnyvale, Calif. 94087

[22] Filed: Mar. 3, 1975

[21] Appl. No.: 554,825

Related U.S. Application Data

[62] Division of Ser. No. 438,137, Jan. 30, 1974, which is a division of Ser. No. 297,506, Oct. 13, 1972, Pat. No. 3,840,163.

[52] U.S. Cl. ............ 228/44.1 A; 228/47; 29/203 P; 324/72.5; 324/158 P; 219/79
[51] Int. Cl.² ........................................ B23K 37/04
[58] Field of Search ............... 228/4.1, 4.5, 5.1, 5.5, 228/6, 44.1, 47, 180; 29/203 B, 203 P, 589, 590, 591; 219/79; 324/72.5, 158 F, 158 P

[56] References Cited
UNITED STATES PATENTS

| | | | |
|---|---|---|---|
| 3,051,026 | 8/1962 | Da Costa | 219/79 X |
| 3,339,704 | 9/1967 | Clark et al. | 324/158 P X |
| 3,477,627 | 11/1969 | Webers | 226/62 X |
| 3,583,063 | 6/1971 | Growney | 228/180 |
| 3,611,061 | 10/1971 | Segerson | 29/589 X |
| 3,613,001 | 10/1971 | Hostetter | 324/158 P |
| 3,696,985 | 10/1972 | Herring et al. | 228/5.5 |
| 3,858,784 | 1/1974 | Diepeveen | 228/4.1 |

Primary Examiner—Harold D. Whitehead
Assistant Examiner—K. J. Ramsey
Attorney, Agent, or Firm—Townsend and Townsend

[57] ABSTRACT

Apparatus for moving a frame of the type for supporting a plurality of integrated circuit chips or die members wherein the frame on a track is moved incrementally along the same by one or both of a pair of pawls pivotally mounted below the track and normally projecting through the plane of the track and into openings in the frame. A reciprocal drive means coupled to the pawls causes the latter to reciprocate, so that the pawls, as they move in reverse, pivot downwardly in the frame and into second frame openings, whereupon the pawls are urged forwardly and they, in turn, advance the frame through a predetermined distance. If the apparatus is used as a die bonder, an improved heat shield is provided for the heater element. Also, an improved die holder is disposed adjacent to and above the heater element. If the apparatus is used as a die test unit, an improved test probe is provided wherein test leads move in engagement with terminals of a die after the die frame has been incrementally advanced.

8 Claims, 15 Drawing Figures

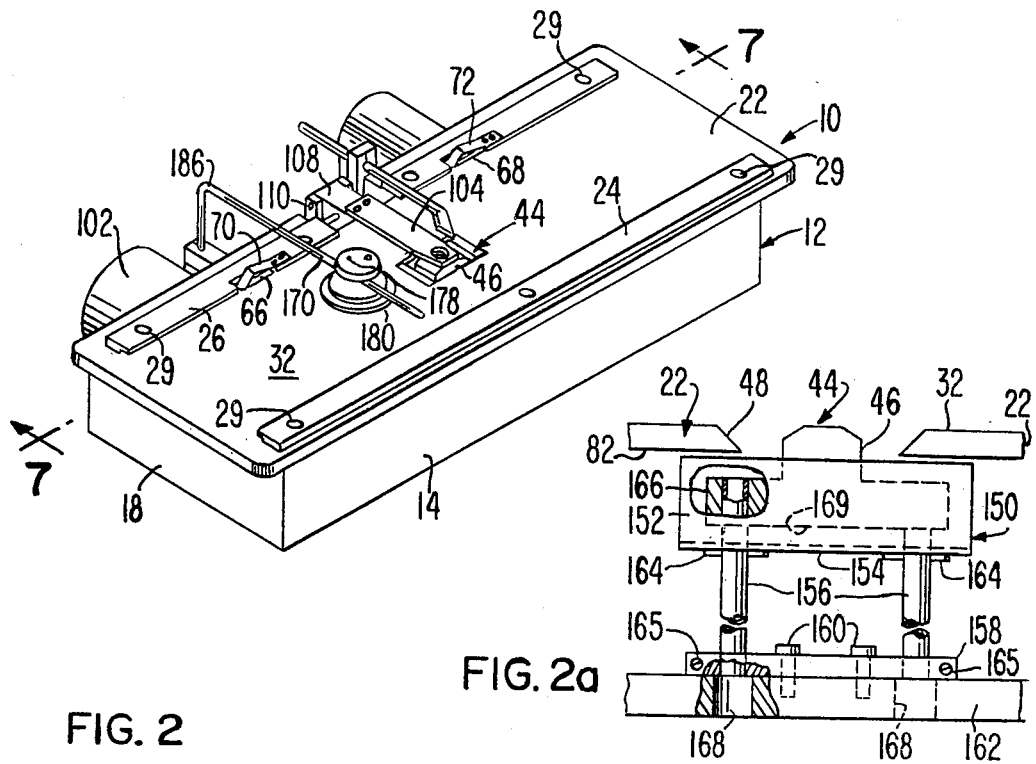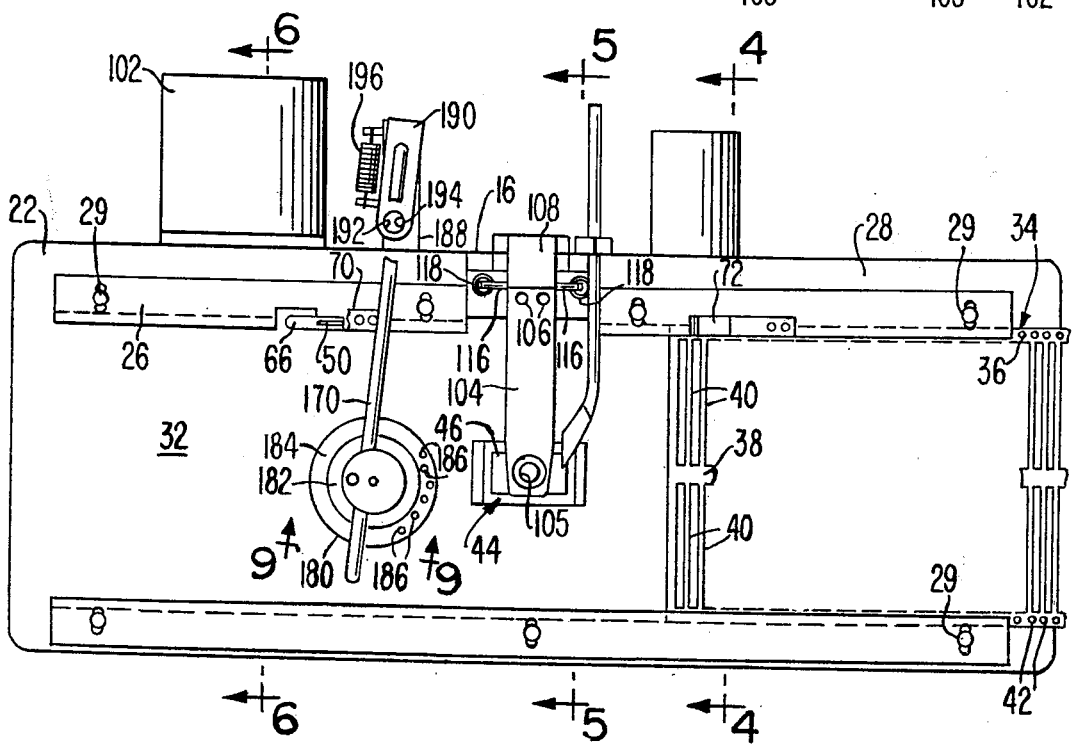

APPARATUS FOR INCREMENTAL MOVEMENT OF DIE FRAME

This is a division, of application Ser. No. 438,137, filed Jan. 30, 1974, the latter being a division of U.S. application Ser. No. 297,506 filed Oct. 13, 1972, now U.S. Pat. No. 3,840,163.

This invention relates to improvements in the handling of die support frames and, more particularly, to apparatus for incrementally moving a die support frame past a die-handling area, such as is used in die bonding, wire bonding and die testing operations.

The present invention is suitable for use in incrementally advancing a die support frame along a predetermined path so that a plurality of die members or integrated circuit chips can be successively bonded to respective locations on the frame when the apparatus is used as a die bonder, or leads can be bonded to die members previously bonded to the frame if the apparatus is used as a wire bonder. Moreover, the incremental advancement of the frame can be utilized in the testing of die members bonded to the frame if the apparatus is to be used as a test probe unit. In all such uses, a die frame is moved incrementally by improved, recirpocal pawl means such as a pair of spaced pawls which move out of engagement as the pawl means reverses but move into engagement with and advance the frame as the pawl means moves forwardly.

The pawls are carried by a reciprocal rod below the path of movement of the frame and the frame itself is generally provided with a grid or network of spaced, metallic terminal strips or spaced sprocket holes at the side margins thereof, whereby the pawls can enter the spaces between the strips or enter the holes so as to engage the frame for moving the same forwardly. The pawls normally project through a frame support plate defining a track along which the frame is moved. Each pawal has a rear inclined margin so that, as the pawl is reversed, it is forced downwardly and out of a space or hole of the frame and into a rearward position at which it is in vertical alignment with the next adjacent space or hole, whereupon bias means coupled with the pawl urges it upwardly and into such aligned space or hole. Then the pawl is urged forwardly, and the pawl thereby engages and advances the frame until the next die support location is in an operative position.

Means for reciprocating the rod includes a rotatable eccentric coupled to a stepper motor. The eccentric also operates a pivotal frame clamp which holds the frame against movement during a die handling operation, such as a die bonding step.

The present invention includes an improved heat shield around the heater element of the apparatus when the latter is used as a die bonder. The shield has tubular support posts providing a chimney effect for directing cool air from beneath the apparatus to a region near the heater element, thereby causing the heat therefrom to rise to the die support of the frame thereabove. Also, the shield prevents adjacent structure from being heated by reflecting the heat radiated by the heater element. Thus, the heat is localized so that injuries to the fingers or hand of the operator of the apparatus will be avoided.

The primary object of this invention is to provide an improved apparatus for advancing a die support frame wherein a pivotally mounted pawl projecting through the frame is reciprocated and urges the frame forwardly an incremental distance after each reversal of the pawl, yet the frame is stationary during pawl reversal to thereby assure movement of the frame in only one direction.

Another object of this invention is to provide apparatus of the type described wherein the pawl is caused to pivot downwardly below and to move along and beneath the frame during pawl reversal but, thereafter, the pawl pivots upwardly and extends through the frame and during forward pawl movement, advances the frame through an incremental distance sufficient to move the next adjacent die support of the frame into an operative position at which a die handling operation can occur.

Other objects of this invention will become apparent as the following specification progresses, reference being had to the accompanying drawings for an illustration of the invention.

FIG. 1 is a perspective view of the apparatus of this invention;

FIG. 2 is an enlarged, top plan view of the apparatus;

FIG. 2a is an enlarged, fragmentary, side elevational view of the heater assembly of the apparatus when the same is used as a die bonder;

Figure 3:
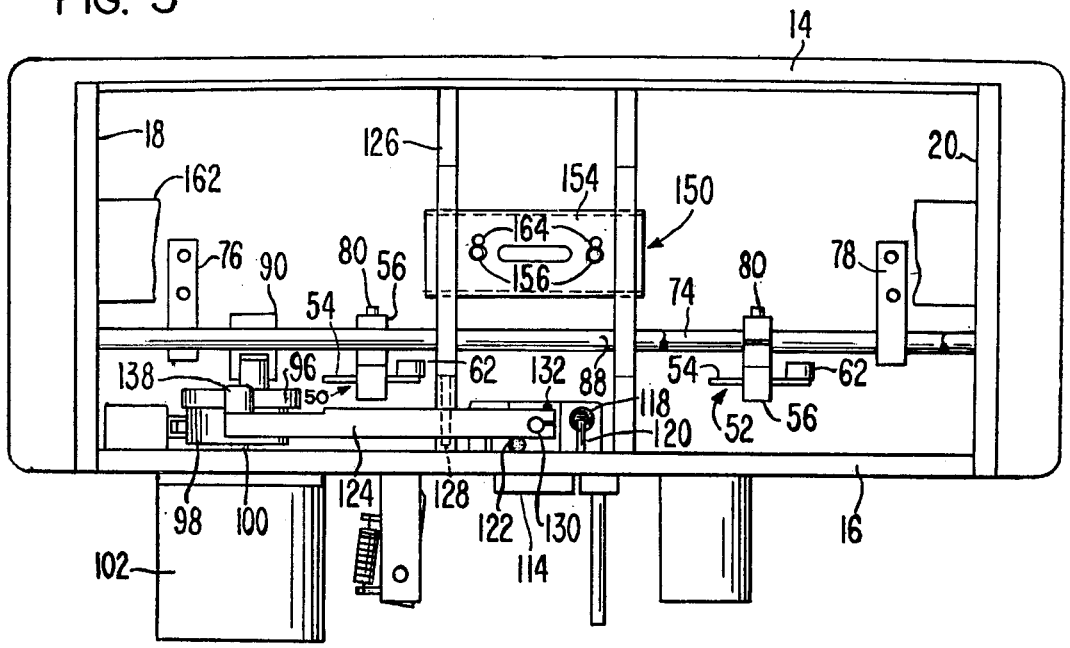
FIG. 3 is a bottom plan view of the apparatus, parts being broken away to illustrate details of construction.

The apparatus of this invention is broadly denoted by the numeral 10 and includes a support 12 comprised of a pair of opposed sidewalls 14 and 16 and a pair of opposed end walls 18 and 20. A generally horizontal plate 22 is mounted on walls 14, 16, 18 and 20 and covers the open upper end of the space surrounded by such walls. Thus, the side and end walls and the top plate define a hollow housing.

Figure 4:
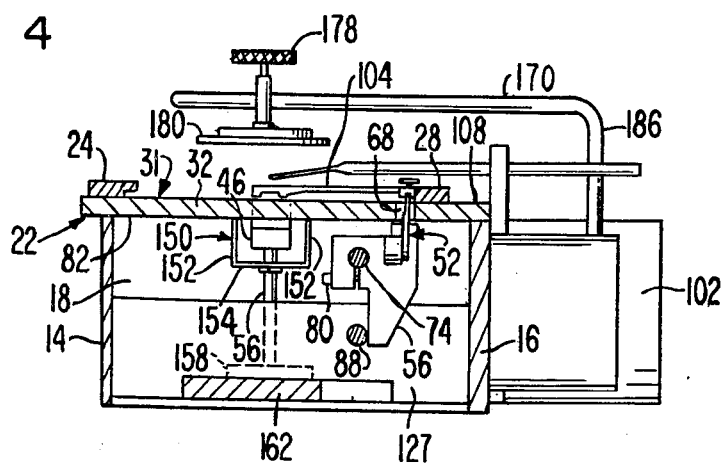
FIG. 4 is a cross-sectional view taken along line 4—4 of FIG. 2.

Plate 22 is provided with a rail or first bar 24 (FIGS. 1, 2, 4, 5 and 6) along one side margin thereof and a pair of spaced second rails or bars 26 and 28 (FIGS. 1, 2, 4, 6 and 7) along the opposite side margin thereof. Bars 24, 26 and 28 are adjustably mounted on plate 22 by screws 29, each bar having a slot-shaped, screw-receiving hole as shown in FIG. 2. The bars have cross sections of the type shown in FIGS. 4–6 wherein each of the bars has a lateral projecting portion 30 (FIG. 4)

which overlies and is spaced above the upper surface 32 of plate 22. Thus, plate 22 and bar portions 30 define a track 31 (FIGS. 4–6) extending longitudinally of the plate in substantial spanning relationship to end walls 18 and 20, the track adapted to receive and guide a generally rigid, metallic die support frame 34 (FIG. 2) of the type for supporting a plurality of integrated circuit chips or the like. Bars 24, 26 and 28 are open at their outer ends so that frame 34 can be manually placed on track 31 at its entrance end (the right end of plate 22 when viewing FIG. 2) and can leave the track at the exit end thereof.

Frame 34, for purposes of illustration, has a pair of opposed, parallel side strips 36 (FIG. 2), a central strip 38 parallel to side strips 36, and a plurality of spaced lateral strips 40 which interconnect central strip 38 with respective side strips 36. Side strips 36 are provided with a plurality of holes 42 therethrough much in the same manner as in photographic movie film. Central strip 38 is adapted to support a plurality of integrated circuit chips or other semiconductor components at spaced locations thereon, specifically in alignment with respective lateral strips 40, the strips serving as leads for terminal points on the chips supported on central strip 38. Frame 34 is of conventional construction and may or may not have openings 42. Other types of chip-supporting frames can be used with apparatus 10, such as those having no holes corresponding to holes 42 and those having a plurality of leads or lateral strips for each chip locations, respectively.

The purpose of apparatus 10 is to advance frame 34 incrementally along track 31 so that the various chip or die locations on central strip 38 are successively moved into overlying relationship with an opening 44 (FIGS. 1, 2 and 5) in plate 22. For purposes of illustration, apparatus 10 is shown in FIGS. 1–9 as a die bonding machine wherein strip 38 is moved incrementally over and past a die bonding heater element 46 (FIGS. 1, 2, 4 and 5) aligned with opening 44 of plate 22. The apparatus could also be used for wire bonding operations wherein a wire bonder carried by support 12 could be used to bond wires to a plurality of spaced chips on a chip-supporting frame which is supported from beneath on a surface disposed in opening 44. In such a case, heater element 46 would be removed to make room for the support surface. Furthermore, a test probe unit 49 (FIGS. 10 and 10a) can be substituted for heater element 46 so that apparatus 10 can be used in the electrical testing of integrated circuit chips as they incrementally advance on frame 34.

Figure 5:
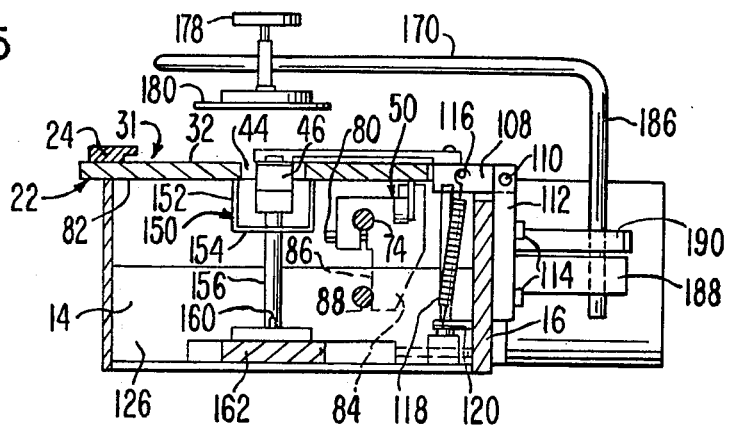
FIG. 5 is a cross-sectional view taken along line 5—5 of FIG. 2.
Figure 6:
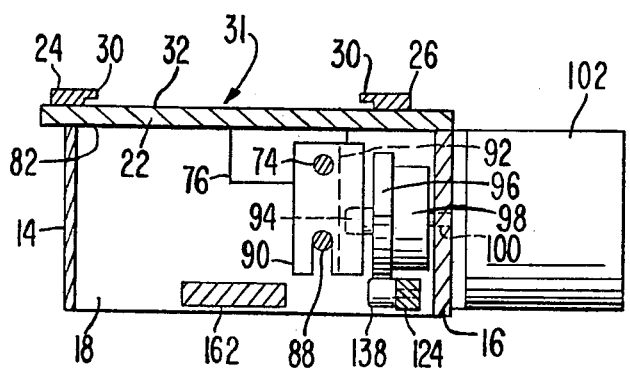
FIG. 6 is a cross-sectional view taken along line 6—6 of FIG. 2.
Figure 7:
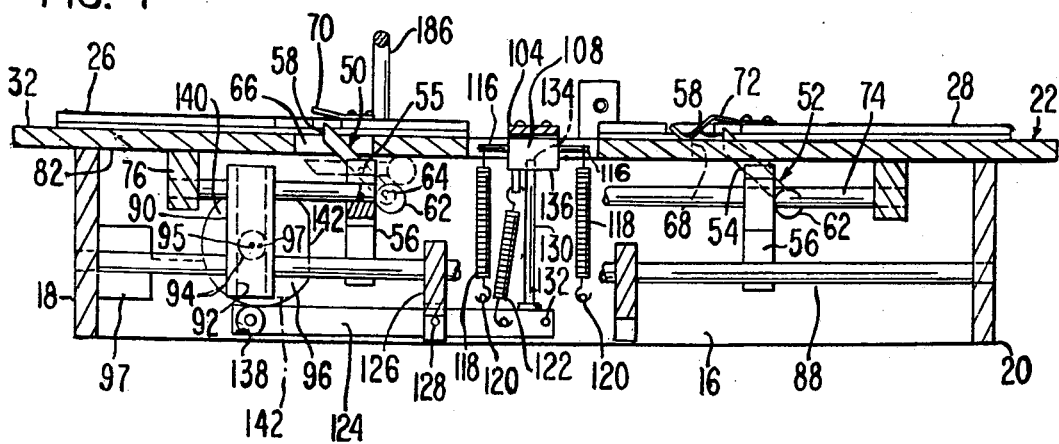
FIG. 7 is a cross-sectional view taken along line 7—7 of FIG. 1.

The means for incrementally moving frame 34 includes a pair of spaced pawls 50 and 52 (FIGS. 4, 5, and 7 and 8), each pawl comprising a rigid bar 54 which is pivotally mounted by a pin 55 on the upper end of a follower 56 disposed below plate 22 (FIGS. 4, 5 and 7). Each bar 54 has a forward edge or margin 58 which is generally perpendicular to track 31 when bar 54 is in its operative position (the full-line position of FIG. 7), i.e., the position at which it moves frame 34 forwardly (to the left when viewing FIG. 2). The rear edge of margin 60 is inclined and convergent to margin 58 so that margins 58 and 60 define a pointed upper end 61 on bar 54.

A counterweight 62 is adjustably and eccentrically mounted by a screw 64 on the lower end of each bar 54, respectively. This counterweight biases the corresponding bar in a clockwise sense when viewing FIGS. 7 and 8, yet allows the bar to pivot into its retracted position (the dashed-line position of FIG. 7.) The counterweight also engages surface 65 of follower 56 so that surface 65 serves as a stop to limit the upward movement of upper end 61 of each pawl. The height h (FIG. 8) of upper end 61 relative to the upper surface 32 of plate 22 can be adjusted by adjusting the position of counterweight 61 with respect to pin 64. Thus, by rotating the counterweight relative to its bar 54 into a new, fixed position, the value of h will change.

Plate 22 has a pair of slots 66 and 68 therethrough in the plane of respective bars 26 and 28 (FIGS. 1, 7 and 8) and disposed below the path of one of the side members 36 of frame 34. These slots are adapted to permit respective pawls 50 and 52 to extend upwardly and through plate 22 so that upper ends 61 of the pawls project above upper surface 32 of plate 22. Thus, upper ends 61 can enter respective, aligned side opendings 42 in frame 34 so that the pawls, in their operative positions (FIG. 8), can push the frame incrementally forwardly as the pawls are shifted incrementally to the left when viewing FIGS. 7 and 8. A pair of spring fingers 70 and 72 overlie respective slots 66 and 68 and serve to hold frame 34 in a fixed position on track 31 as the pawls retract and move rearwardly in a manner to be described.

Followers 56 (FIGS. 3, 4, 5 and 7) are rigidly secured to a first rod 74 which extends longitudinally of track 31 and is shiftably mounted for longitudinal movement in a pair of bearing blocks 76 and 78 (FIGS. 3 and 7) rigidly secured to the lower surface 82 of plate 22. A screw 80 (FIG. 5) adjustably clamps each follower 56 to rod 74, whereby the position of the corresponding pawl can be adjusted relative to its slot through plate 22. Each follower 56 has a lower extension 84 (FIGS. 4 and 5) having a side surface 86 normally slidably engaging one side of a second, fixed rod 88 parallel to rod 74 and end walls 18 and 20 in spanning relationship thereto. Rod 88 serves as a guide for followers 56.

A coupling element 90 (FIGS. 6 and 7) is secured to first rod 74 and depends therefrom. Element 90 has a vertically disposed channel 92 (FIG. 6) for shiftably receiving a cylindrical roller 94 eccentrically mounted on a disk 96 having a cylindrical base 98 secured to the drive shaft 100 of a stepper motor 102 rigid to and extending laterally from sidewall 16 (FIGS. 3, 4, 5 and 6). Roller 94 operates to cause horizontal reciprocation of element 90 relative to and along rod 88. As shown in FIG. 7, the axis 95 of roller 94 is spaced laterally from the axis 97 of disk 96. As the disk is rotated under the influence of stepper motor 102 through a complete revolution, roller 94 rotates about axis 97 and, as it does, it moves element 90 from a starting position first to the right (when viewing FIG. 7) through a first distance, and then back to the left through the first distance, and beyond through a second distance, and then back to the right through the second distance to its starting position. When element 90 is reciprocated, it causes rod 84 to reciprocate and this, in turn, causes reciprocation of followers 56 and respective pawls 50 and 52.

In FIG. 7, element 90 is shown at its extreme lefthand position, just before it is returned to the right to its starting position. When element 90 is in its starting position, pawls 50 and 52 are tilted more to horizontal as shown by the dashed line positions thereof in FIG. 7. This is because frame 34 will cause the pawls to rock in a counterclockwise sense and out of respective frame holes, yet will remain in respective slots 66 and 68 as element 90 is returned to its starting position. The pawls, in their starting positions, are half-way between the holes they have just left and the holes they will next enter. A switch 94a (FIG. 7) coupled with disk 94 stops motor 102 when element 90 returns to its starting position. An override circuit coupled with motor 102 actuates the same at the beginning of a frame-moving operation.

Figure 8:
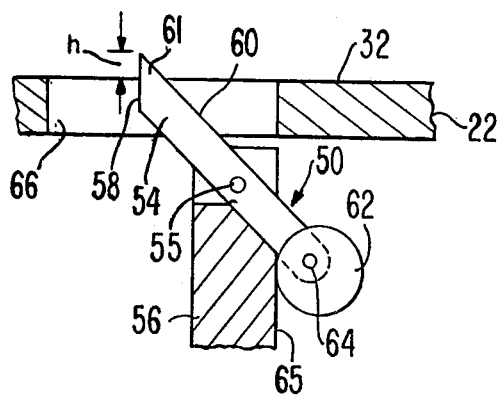
FIG. 8 is an enlarged, fragmentary, vertical, cross-sectional view of the apparatus, showing a frame-moving pawl thereof.
Figure 9:
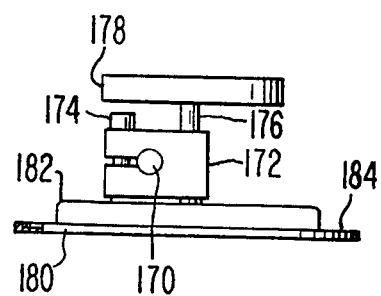
FIG. 9 is a fragmentary, side elevational view of the die support above the frame-supporting surface of the apparatus.

As the pawls are shifted to the right when viewing FIGS. 7 and 8 from their starting positions, they will be moved through a distance sufficient to permit the upper end 61 of each pawl to be aligned with the next adjacent holes 42, whereupon the bias action of the corresponding counterweight 62 will cause the upper end 61 of the pawl to enter the aligned hole thereabove. Upon movement of each pawl to the left, its front margin 58 will engage the frame and advance it incrementally to the left, thereby moving the next die support of central strip 38 into overlying relationship to the central portion of opening 44. Then, the pawls are returned to their starting positions as element 90 is moved a short distance to the right as described above. While a pair of pawls have been shown, only a single pawl can be used to move the frame. However, two pawls are provided on opposite sides of opening 44 so that at least one pawl is in driving engagement with the frame at all times.

A frame clamp finger 104 (FIGS. 1, 2, 4 and 5) is provided for apparatus 10 when the latter is to be used as a die bonder. Finger 104 extends across a portion of upper surface 32 of plate 22 and terminates adjacent to opening 44 as shown in FIG. 2. Finger 104 clamps the frame against movement relative to surface 32 as the pawls are reversed (shifted to the right when viewing FIG. 7), i.e., as each pawl moves out of one hole 42 and into alignment with the next adjacent hole 42. In this way, the pawls are assured of moving into the next pair of adjacent holes 42 to provide for positive forward incremental movement of frame 34.

Finger 104 is secured by screws 106 (FIG. 2) to a first block 108 pivotally mounted by a pin 110 (FIG. 1) on a second block 112 adjustably secured by screws 114 (FIG. 5) to the outer surface of sidewall 16, the holes in block 112 for screws 114 being enlarged to provide for the adjustability of the block in the x–y direction. In this way, the inclination of the finger can be adjusted, if necessary, to render the finger parallel to the upper surface of heater element 46. A pair of laterally projecting pins 116 at opposed sides of block 108 are coupled to the upper ends of a pair of coil springs 118 which extend downwardly adjacent to the inner surface of sidewall 16 and are secured to projections 120 (FIG. 7) on the inner surface of sidewall 16. The springs are under tension so that finger 104 is biased downwardly toward surface 32. A third spring 122 (FIG. 7) is coupled at its upper end to block 108 and at its lower end to a bar 124 pivotally mounted on a crossbrace 126 (FIG. 7) by a pin 128 which is horizontally disposed. Brace 126 is rigid to and spans the distance between sidewalls 14 and 16. Spring 122 is under tension; thus, bar 124 is biased by spring 122 in a counter-clockwise sense when viewing FIG. 7.

Figure 11:
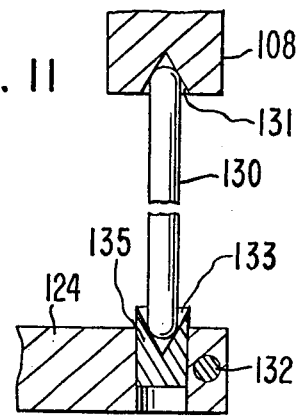
FIG. 11 is an enlarged vertical cross-section of the mechanism for raising or lowering the frame clamp finger of the apparatus.
Figure 11A:
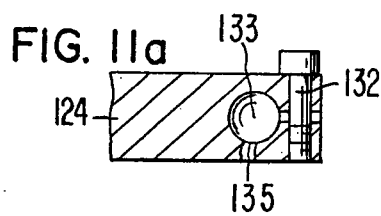
FIG. 11a is a top plan view of a part of the mechanism of FIG. 11.

A vertical rod 130 spans the distance between block 108 and bar 124 and is pivotal relative thereto as shown in FIG. 11. Both ends of rod 130 are convex, the upper end being pivotally received in a conical recess 131 in block 108 and the lower end being pivotally received in a conical recess 133 in a shiftable member 135 adjustably secured by a screw 132 to bar 124 (FIGS. 11 and 11a).

The opposite end of bar 124 has a roller 138 which engages the outer periphery 140 of disk 94 during movement of the pawls. During such pawl movement, finger 104 is slightly spaced above opening 144, thereby allowing frame 34 to move beneath finger 104 and across the heater element 46. However, disk 96 has a flat, outer peripheral segment 142 (FIG. 7) which moves into overlying relationship to roller 138 as element 90 returns to its starting position after each incremental frame movement. When this occurs, bar 124 is allowed to rotate through a small arc in a clockwise sense (FIG. 7) about pin 128, causing the outer end of finger 104 to again engage frame 34 and clamp it to heater element 46.

Roller 138 normally does not engage flat segment 142 because the outer end of finger 104 engages frame 34, before this occurs. Also, the inclination of finger 104 can be adjusted by the adjustment of the height of rod 130 by manipulating the height of member 135 to accommodate bent frames or chips of different heights. Thus, the apparatus is suitable for use in wire bonding operations as well as die bonding operations. The outer end of finger 104 has a central hole 105 therethrough to provide access to the die support of frame 34 or to a die on such die support.

In FIG. 2a, a transversely U-shaped heat shield 150 is provided to localize the radiant and conducted heat from heater element 46. Shield 150 has a pair of opposed sides 152 (FIG. 4) and a bottom 154. It is open at the ends and at the top and is loosely supported by respective cotter pins 164 (FIGS. 2a and 3) on a pair of tubular posts 156 which are adjustably secured to and extend upwardly from a mounting bracket 158 secured by screws 160 to a bar 162 (FIG. 3) which is rigid to and spans the distance between the end walls 18 and 20. Cotter pis 164 pass through holes in respective posts 156. Bracket 158 has a pair of clamping screws 165 which adjustably secure the lower ends of posts 156 to bracket 158, thereby permitting the height of heater element 46 relative to opening 44 to be varied.

Heat shield 150 is formed of thin, polished, stainless steel and reflects heat radiated thereto by heater element 46. Also, the loose connection of the heat shield on posts 156 minimizes heat loses to the posts by conduction.

The upper and lower ends of each post 156 are open as shown in FIG. 2a, the upper end of each post being secured to a lateral extension 166 (FIG. 2a) of heater 46. The lower, open end of each post 156 is in vertical alignment with a respective opening 168 through bar 162, so that posts 156 operate as chimneys to direct cooling air from a location below bar 162 to the regions on opposed sides of heater element 46. The lower surface 169 (FIG. 2a) of heater element 46 is spaced above bottom 154 of heat shield 150 by a distance equal to the spacing between heater element 46 and each side 152 of the heat shield. This construction of the heat shield localizes the heat radiated from heater element so that the person using apparatus 10 will not suffer burns to the fingers and hand during die bonding operations.

A swingable rod 170 (FIGS. 1, 2, 4, 5, 6 and 7) is swingably mounted on support 12 for movement through a small arc in a plane above and substantially parallel with the plane of plate 22. Rod 170 has a bracket 172 (FIG. 9) clamped thereto by a screw 174.

A stub shaft 176 is rotatably mounted in bracket 172 and has a knob 178 at its upper end. A disk 180 having an annular base 182 thereabove is secured to the lower end of shaft 176 so that, when knob 178 is rotated, disk 180 rotates relative to rod 170.

The upper, annular surface 184 of disk 180 operates to support a plurality of integrated circuit chips 186 to be bonded to frame 34 on central strip 38 thereof. Rod 170 is mounted so that, when it is swung in a counterclockwise sense when viewing FIG. 2, the chips on surface 184 are moved into proximity to opening 44. Thus, the operator of apparatus 10 can continue to view a chip-supporting location of frame 34 aligned with heater element 46 through a microscope as the outer peripheral margin of disk upper surface 184 is moved into a part of the optical path of the microscope, thereby permitting the operator to transfer a chip from surface 184 onto frame 34 without moving the head away from the microscope. This will facilitate a die bonding operation and make such operation less tedious for the operator.

Rod 170 has a vertical leg 186 (FIGS. 1, 4, 5 and 7) pivotally mounted in a lateral extension 188 rigid to and extending outwardly from sidewall 16. Leg 186 has a short bar 190 rigid to it and extending toward sidewall 16. Bar 190 has a hole 192 therethrough which receives a pin 194 secured to and extending upwardly from extension 188, pin 194 serving as a stop to limit the swinging movement of rod 170. A coil spring 196 coupled to extension 188 and bar 190 biases rod 170 in a clockwise sense when viewing FIG. 2.

OPERATION

Apparatus 10 is used by first manually placing frame 34 at the entrance end (the right-hand end when viewing FIG. 2) of track 31. The frame is then manually moved along the track until the left-hand end of strip 38 is adjacent to heater element 46. Then, assuming heater 46 is energized so that it is at a pre-determined operating temperature, stepper motor 102 is actuated so that it causes the pawls to reciprocate in the manner described.

Figure 12:
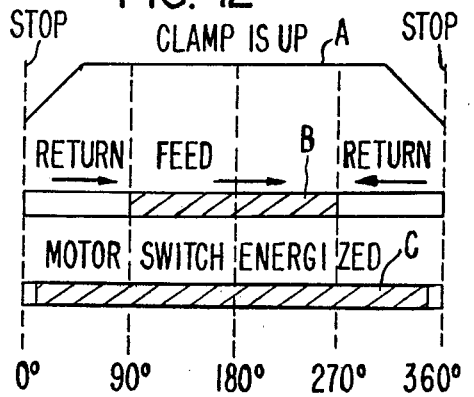
FIG. 12 is a timing diagram showing the sequence of operation of the apparatus.

As disk 96 rotates through a single revolution, the pawls move to the right below the plane of upper surface 32 of plate 22 until upper ends 61 of the pawls move into alignment with the next adjacent holes 42. Then, upper ends 61 enter the aligned holes 42 thereabove and the pawls force frame 34 forwardly as disk 96 continues to rotate. The total distance traveled by frame 34 is such that the next adjacent die support on the frame is vertically aligned with heater element 46. During the forward travel of the pawls, clamp finger 104 is elevated to allow frame 34 to move over track 31. After the frame has been moved, the pawls return to their starting positions. The timing diagram of FIG. 12 illustrates the sequence of operation of apparatus 10. Curve A indicates the time in which Clamp 104 is up during a complete revolution of disk 94. Curve B indicates frame movement during each revolution, and Curve C indicates the time during which motor 102 is energized.

During a die bonding operation, the heat radiated from heater element 46 is intercepted by the sides and bottom of heat shield 150 and the heat is reflected toward the heater element. During this time, air rises in posts 156 by convection, thereby drawing air into the lower openings 168 in bar 162 (FIG. 2a).

The small amount of heat loss through the open ends and the top of shield 150 is not sufficient to heat the surrounding structure to any appreciable degree; thus, the operator of apparatus 10 will not suffer discomfort if the hands or fingers contact the structure adjacent to element 46.

If apparatus 10 is to be used as a wire bonder, heater element 46 is replaced by structure defining a frame support surface provided in opening 44 and a wire bonding tool is mounted in any suitable manner on support 12. Then, a frame having a plurality of chips previously bonded thereto can be incrementally moved over track 31 in the manner described above. Each time a chip is aligned centrally of opening 44, a wire bonding operation can occur wherein a plurality of wires are bonded to the chip. In such a case, clamp finger 104 is used to clamp the frame against movement during the operation. It may be necessary to adjust the arc of movement of clamp finger 104 to allow clearance of the chips as frame 34 carrying the chips is moved by the pawls. This adjustment is made by moving rod 130 (FIG. 7) releasably secured at its lower end to bar 124.

Test probe unit 49 (FIGS. 10 and 10a) includes a bracket 200 secured by screws 106 to swingable block 108; thus, bracket 200 replaces clamp finger 104 when apparatus 10 is to be used in testing integrated circuit chips or the like carried on frame 34. The height of bracket 200 relative to upper surface 32 can be varied by adjusting the vertical position of block 112 on sidewall 16.

Bracket 200 has a pair of inclined recesses 204 extending thereinto from a pair of sides thereof. Each recess frictionally receives an insulating block 206 having a number of spaced, electrically isolated leads 208 extending along the same, the lower ends of the leads projecting outwardly from respective blocks and disposed for contacting corresponding terminals on a chip to be tested. Recesses 204 are inclined oppositely relative to each other so that blocks 206 converge as their lower ends are approached. A rigid support 210 in opening 44 is provided to support frame 34 as leads 208 are disposed above and move into contact with the clip aligned with opening 44 during test operation.

Figure 10:
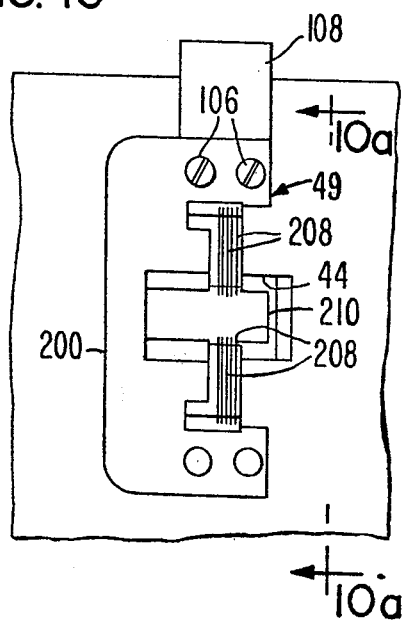
FIG. 10 is a fragmentary, top plan view of a test unit on the apparatus when the latter is used to test semiconductor components.
Figure 10A:
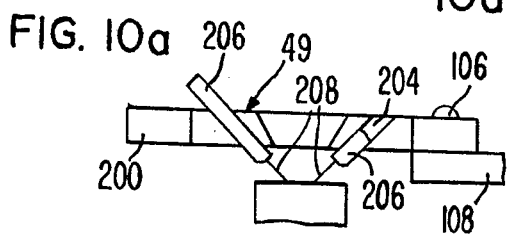
FIG. 10a is an end elevational view of the test unit.

Apparatus 10 is used in the manner described above to move frame 34 incrementally relative to opening 44 when test probe unit 49 is mounted as shown in FIGS. 10 and 10a. Leads 208 are coupled to test equipment (not shown) whereby, as motor 102 cycles, frame 34 is advanced incrementally and bracket 200 is elevated during frame movement because block 108 pivots upwardly as the pawls reciprocate when the frame is in a new position, bracket 200 will have been lowered, causing the lower ends of leads 208 to move into contact with respect to terminals on the chip therebelow. In this way, each chip can be tested to determine its quality before it is separated from the frame and packaged.

While pawls 50 and 52 have been described as positioned to enter side holes 42, it is possible that plate 22 could have slots 66 and 68 more toward the center of track 31. In such a case, the pawls could enter the spaces between lateral strips 40 of frame 34, thus rendering apparatus 10 suitable for use with frame having no side holes 42.

I claim:

1. Apparatus for incrementally advancing a die support frame having a plurality of openings therethrough comprising: a support; means on said support for defining a track over which a die support frame can move; a pawl for entering any one of said frame openings; means on one side of the track for mounting the pawl for pivotal movement in a plane transverse to said track; means coupled with said pawl for biasing the same across the track; and means coupled with said mounting means for reciprocating the latter and thereby said pawl to cause the latter to enter a frame opening and to move the frame as the pawl is moved in one direction and to cause the pawl to exit from a frame opening as the pawl moves in the opposite direction, wherein said track defining means includes a plate having an opening therein, and wherein is included a heater element, means mounting said heater element in said opening in a position in heat exchange relationship to said frame when the latter is disposed on said track, and means defining a heat shield adjacent to said heater element.

2. Apparatus as set forth in claim 1, wherein said heater element mounting means includes a tubular, open end post adjustably secured at one end to said support and rigidly coupled at its opposite end to said heater element, said post being disposed to provide a chimney for directing air from a location below said heater element to a location adjacent thereto.

3. Apparatus as set forth in claim 2, wherein said heat shield includes an elongated, transversely U-shaped member having a pair of opposed sides on opposite sides of said heater element and a bottom therebelow, there being pin means extending through said post and supporting said bottom.

4. Apparatus as set forth in claim 1, wherein is included a clamp finger pivotally mounted on the support above said plate for movement into and out of clamping relationship to a frame on the track, and means responsive to said reciprocating means for moving said clamp finger toward and away from said plate in sequence with the reciprocation of said pawl.

5. Apparatus as set forth in claim 4, wherein said moving means includes a pivotal bar coupled to said reciprocating means, and a rod adjustably secured at one end thereof to said bar and coupled at its opposite end to said clamp finger in spaced relationship to its axis of pivotal movement, and means biasing said clamp finger toward said plate.

6. Apparatus as set forth in claim 1, wherein is included a die holder, and means coupling the die holder on said support for movement from a position spaced from said opening to a position adjacent to said opening.

7. Apparatus as set forth in claim 6, wherein said die holder includes a disk having a flat upper surface, said coupling means includes a rod pivotally mounted on said support for movement in a generally horizontal plane above said plate, and bracket means rotatably mounting said disk on said rod.

8. Apparatus for incrementally advancing a die support frame having a plurality of openings therethrough comprising: a support; means on said support for defining a track over which a die support frame can move; a pawl for entering any one of said frame openings; means on one side of the track for mounting the pawl for pivotal movement in a plane transverse to said track; means coupled with said pawl for biasing the same across the track; and means coupled with said mounting means for reciprocating the latter and thereby said pawl to cause the latter to enter a frame opening and to move the frame as the pawl is moved in one direction and to cause the pawl to exit from a frame opening as the pawl moves in the opposite direction, wherein said track defining means includes a plate having an opening therethrough, and including a die test unit provided with means defining a plurality of test probes, and means mounting said test unit on said support for movement toward and away from said plate to permit said test probes to move into and out of electrical contact with respective terminals of a die on a frame disposed on said track, and means defining a frame support surface in said opening.

* * * * *